United States Patent
Kadanka

(10) Patent No.: US 7,579,892 B2
(45) Date of Patent: Aug. 25, 2009

(54) ACCURATE TIMING GENERATOR AND METHOD THEREFOR

(75) Inventor: Petr Kadanka, Valasska Bystrice (CZ)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 238 days.

(21) Appl. No.: 11/441,328

(22) Filed: May 26, 2006

(65) Prior Publication Data

US 2007/0273423 A1    Nov. 29, 2007

(51) Int. Cl.
*G06F 1/04* (2006.01)
(52) U.S. Cl. ................................. 327/291; 327/299
(58) Field of Classification Search .................. None
See application file for complete search history.

(56) References Cited

U.S. PATENT DOCUMENTS

| | | | | |
|---|---|---|---|---|
| 5,502,746 A | * | 3/1996 | Ozguc | 375/317 |
| 5,805,232 A | * | 9/1998 | Ninomiya | 348/529 |
| 6,838,916 B2 | * | 1/2005 | Premont et al. | 327/132 |
| 7,109,804 B2 | * | 9/2006 | Mader et al. | 331/16 |
| 7,196,523 B1 | * | 3/2007 | Yamada | 324/428 |
| 2006/0077697 A1 | * | 4/2006 | Yang | 363/21.13 |

OTHER PUBLICATIONS

"NCP1395A/B High Performance Resonant Mode Controller," Copyright 2006, Semiconductor Components Industries, LLC, Mar. 2006 —Rev. 1, pp. 1-26.
"L6598 High Voltage Resonant Controller," Copyright 2004 STMicroelectronics, pp. 1-17.

\* cited by examiner

*Primary Examiner*—Cassandra Cox
(74) *Attorney, Agent, or Firm*—Robert F. Hightower

(57) ABSTRACT

In one embodiment, a reference generator forms a reference signal that may have temperature and process variations. A comparator that has similar variations is used to detect a signal using the reference.

16 Claims, 6 Drawing Sheets

ACCURATE TIMING GENERATOR AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to form timing generators that were used to generate a timing interval for use in circuits. One common type of timing generator is illustrated in FIG. 1. For this timing generator a current source provided a current to a capacitor. An operational amplifier, configured as a comparator, compared the voltage on the capacitor to a reference voltage and generated a control signal on the output of the comparator. When the voltage on the capacitor reached the value of the reference voltage, the output of the comparator was expected to change. However, the comparator had an internal delay that caused the output to change some time after the capacitor voltage reached the reference value. This delay affected the time period generated by the timing generator. The graph to the right of the circuit illustrates the inaccuracy of the timing generator. Plot A represents the voltage on the capacitor and a plot B represents the output signal from the comparator. When the voltage on the capacitor reached the reference value at time D, the output signal from the comparator did not change state but changed at a time E that was some time period C after the capacitor voltage reached Vref. This parasitic delay of the comparator resulted in an inaccurate time period. Additionally, the delay time, time C, was also dependent on temperature and could vary also from one timing generator to another due to semiconductor process variations.

Accordingly, it is desirable to have a timing generator that more accurately forms a desired time interval, that generates a time interval that is less temperature dependent, and that generates a time interval that is less dependent on semiconductor process variations.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 2:
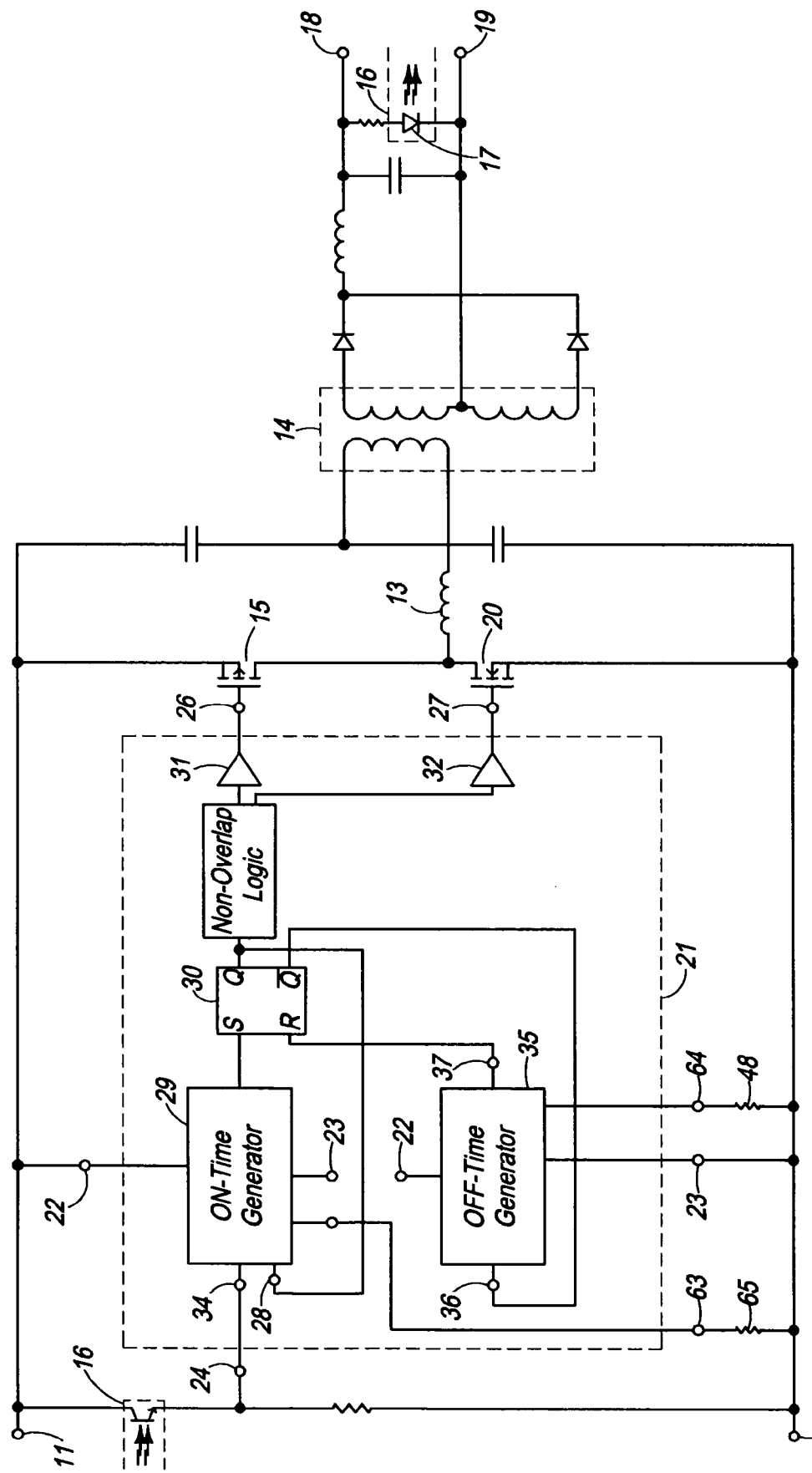
FIG. 2 schematically illustrates an embodiment of a portion of a block diagram of a resonant power supply converter in accordance with the present invention.

FIG. 2 schematically illustrates an exemplary form of a portion of a block diagram of a resonant power supply converter 10 that uses timing generators to create frequency modulated (FM) control signals that are utilized to regulate the value of the output voltage of converter 10. Converter 10 generally includes an FM controller 21 that forms the FM control signals. Converter 10 receives a voltage, such as a DC voltage, between a voltage input terminal 11 and a voltage return terminal 12. Converter 10 also usually includes upper and lower switches implemented as transistors 15 and 20 that alternately supply current to and discharge current from an inductor 13 and a transformer 14. Transformer 14 couples power from a primary to a secondary side in order to couple power to outputs 18 and 19. An optical coupler 16 may be connected between outputs 18 and 19 to form a feedback (FB) signal that is representative of the value of the output voltage between outputs 18 and 19. The feedback (FB) signal is received by controller 21 on a FB input 24.

Controller 21 usually includes an on-time generator 29, an off-time generator 35, an RS latch 30, and output buffers 31 and 32 that have a drive capability suitable for driving transistors 15 and 20. Controller 21 usually receives an input voltage from terminal 11 between a voltage input 22 and a voltage return 23. On-time generator 29 generates a first time interval that establishes an on-time interval that latch 30 is set. The on-time interval that latch 30 is set also establishes substantially the time that transistor 15 is enabled (minus some delay time introduced by a non-overlap logic block). The on-time interval formed by generator 29 usually is also dependent on the value of the feedback voltage, thus, the on-time interval formed by generator 29 varies based on the value of the FB signal. Off-time generator 35 generates a second time interval that establishes an off-time interval that latch 30 is reset. The off-time interval that latch 30 is reset also establishes substantially the time that transistor 15 is disabled (minus the delay time introduced by the non-overlap logic block).

Assume that the second control signal on the output of generator 35 goes high. The high from generator 35 resets latch 30 which forces the Q output low and the Q bar output high. The high Q bar output resets generator 35 and forces the output of generator 35 low. The low Q output of latch 30 enables transistor 15 and disables transistor 20 through the non-overlapping logic block. The non-overlapping logic block ensures that there is a dead-time between enabling and disabling transistors 15 and 20 in order to prevent shoot-through currents. The low from the Q output also enables generator 29 to initiate the on-time interval. After the on-time interval expires, generator 29 asserts the first control signal and sets latch 30. The high Q output from latch 30 disables transistor 15 while enabling transistor 20. Thus, the first time interval formed by generator 29 establishes the on-time of the FM control signal on the Q output of latch 30. The high Q output also resets generator 29 which forces the first output low. Off-time generator 35 receives the low from the Q bar output of latch 30 and initiates generating the off-time interval. While generator 35 is forming the off-time interval, the output of generator 35 is low and the FM control signal on the Q output of latch 30 is disabled. When the off-time interval expires, the output of generator 35 is forced high to reset latch 30 thereby forcing the Q output of latch 30 low and the Q bar output high. The low Q output enables transistor 15 and disables transistor 20 after the delay times introduced by the non-overlap logic block. The low Q output also again enables generator 29 to begin forming the on-time interval. The high Q bar output resets generator 35 and forces the output of generator 35 low. Thus, the second time interval formed by generator 35 establishes the off-time of the FM control signal on the Q output of latch 30. Since the time interval formed by generator 35 sets the off-time for the FM control signal, it is important to precisely control the time interval formed by generator 35.

Figure 3:
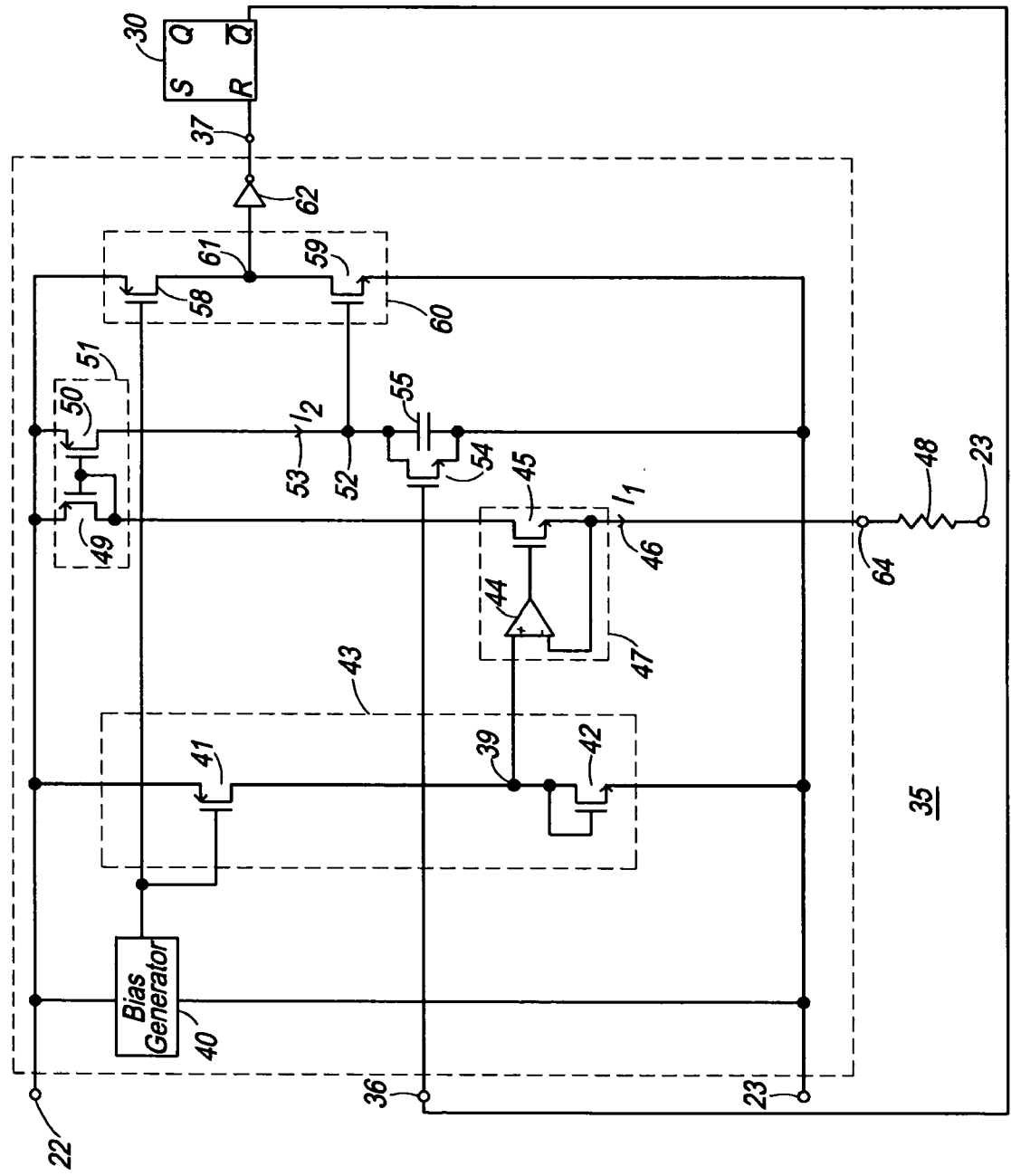
FIG. 3 schematically illustrates an embodiment of a portion of a timing generator that is used in the resonant power supply converter of FIG. 2 in accordance with the present invention.

FIG. 3 schematically illustrates an embodiment of a portion of off-time generator 35. Generator 35 usually includes a bias generator 40 that is utilized to form a bias voltage for other elements of generator 35. Bias generator 40 may be any well-known type of precision reference circuit. Generator 35 also generally includes a reference generator 43, a voltage-to-current converter 47, a current mirror 51, a capacitor 55, a discharge switch implemented as a transistor 54, a comparator 60, and an inverting buffer 62. An output 37 of generator 35 usually is connected to the reset input of latch 30 and a discharge input 36 of generator 35 generally is connected to the Q bar output of latch 30. A resistor 48 is connected to converter 47. Resistor 48 generally is external to generator 35 and external to the semiconductor die on which generator 35 is formed so that resistor 48 may be a precision resistor having a very accurate resistance value. Resistor 48 usually is connected to an input 64 of controller 21.

Reference generator 43 generally includes a bias transistor 41 that is connected to receive the bias voltage from bias generator 40 and a diode connected transistor 42 that receives a bias current from transistor 41. Transistor 42 forms a reference voltage on a reference node 39 of reference generator 43. The value of the reference voltage is a function of the gate-to-source threshold voltage (Vgs) of transistor 42. Because Vgs is a function of temperature and process parameters, the value of Vgs may drift or change based upon temperature and may vary from one semiconductor die to a different semiconductor die based on process parameters. Voltage to current converter 47 generally includes an operational amplifier 44, such as a transconductance amplifier, and a transistor 45 that are configured to receive the reference voltage from node 39 and form a current 46 that is representative of the value of the reference voltage on node 39. Current 46 is also labeled as and may be referred to as current I1. Current 46 flows through resistor 48 and forms a voltage drop across resistor 48 that is substantially equal to the value of the reference voltage on node 39. Thus, the value of current 46 is given by:

$I1 = Vgs(42)/R48$

Where:
I1=current 46,
R48=the value of resistor 48, and
Vgs(42)=the Vgs of transistor 42

Current mirror 51 includes a first transistor 49 and a second transistor 50 connected in a current mirror configuration. Mirror 51 receives current 46 and forms a charging current 53 that is ratioed to the value of current 46 by the ratio of the active area of transistors 49 and 50. In the preferred embodiment, the ratio is approximately 1:1 so that the value of current 53 is substantially equal to the value of current 46. Although current 53 is intended to be the same as current 46, those skilled in the art will appreciate that the value of current 53 may vary slightly from the value of current 46 due to process and other well-know variations. Current 53 charges capacitor 55 to form a time dependent signal on a node 52. The voltage formed on node 52, as capacitor 55 charges, is received by comparator 60. Comparator 60 generally includes a comparator transistor 59 and a bias transistor 58. Bias transistor 58 is configured to receive the bias voltage from generator 40 and form a bias current that is applied to transistor 59. Transistor 59 compares the voltage on node 52 to the gate-to-source threshold voltage (Vgs) of transistor 59. When the value of the voltage on node 52 reaches substantially the same value as the Vgs of transistor 59, transistor 59 is enabled to pull node 61 low and force output 37 high. The amount of time required to charge capacitor 55 to the Vgs of transistor 59 is given by:

$T = (Vgs(59) * C55)/I2$

Substituting I1 for I2 gives $T = (C55 * R48) * (Vgs(59)/Vgs(42))$.

Where:
T=time to charge capacitor 55,
I2=current 53, and
Vgs(59)=Vgs of transistor 59.

Thus, the time required to charge capacitor 55 is a function of the threshold voltages of transistors 42 and 59 in addition to the value of resistor 48 and capacitor 55. In an integrated circuit, it is possible to form two transistors to have substantially equal threshold values. Additionally, the threshold values will both vary in the same way due to temperature variations and due to process variations. Thus, variations in the threshold voltages cancel each other in the above equation and the resulting time interval is independent of temperature and process variations.

Figure 1:
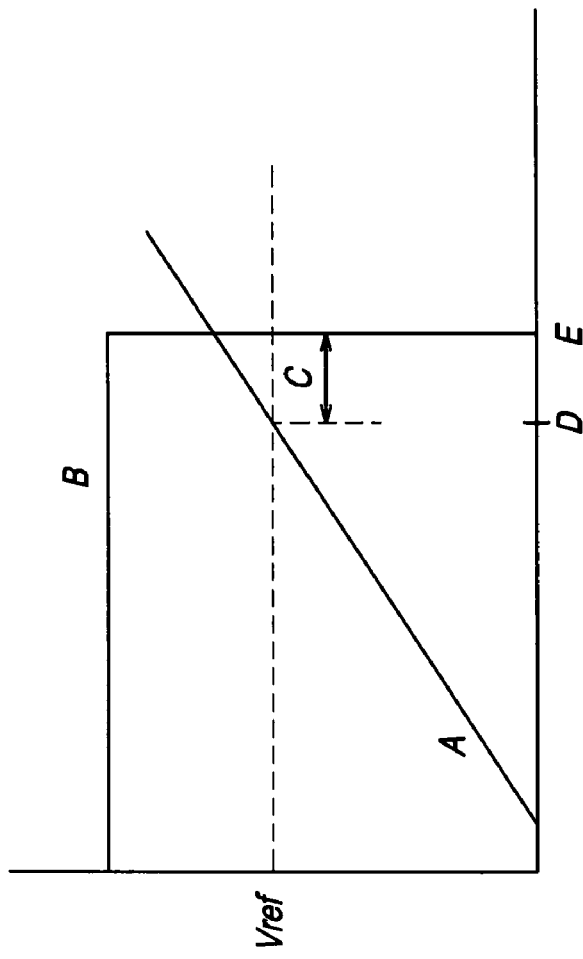
FIG. 1 schematically illustrates a prior art timing generator.
Figure 1:
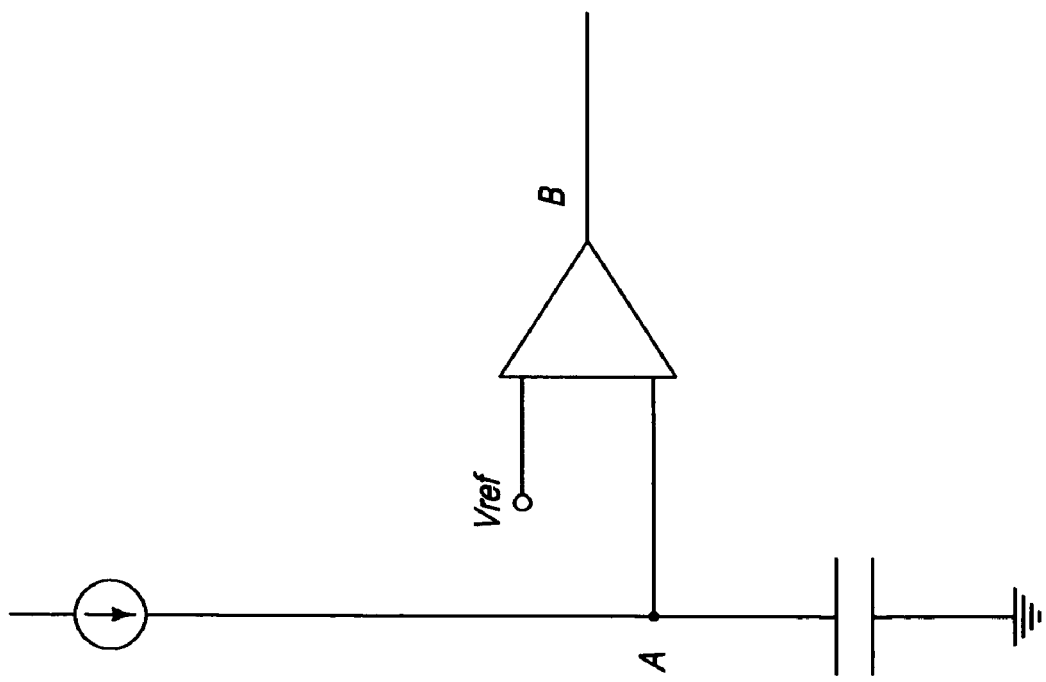

As explained in the description of FIG. 1, if latch 30 becomes set, the Q bar output goes low. Generator 35 receives the low Q bar output which disables transistor 54. Since transistor 54 was previously enabled, node 52 is low and node 61 is high, thus, output 37 is low. Disabling transistor 54 enables generator 35 to begin charging capacitor 55 and begin forming the off-time interval. Output 37 remains low until capacitor 55 charges to the Vgs of transistor 59. When the value of the voltage on node 52 becomes substantially equal to the Vgs of transistor 59, transistor 59 is enabled to pull node 61 low and force output 37 high. The high from output 37 resets latch. Generator 35 receives the high Q bar output and enables transistor 54 to discharge capacitor 55 and pull node 52 low. The low from node 52 disables transistor 59 and allows output 37 to go low.

Figure 4:
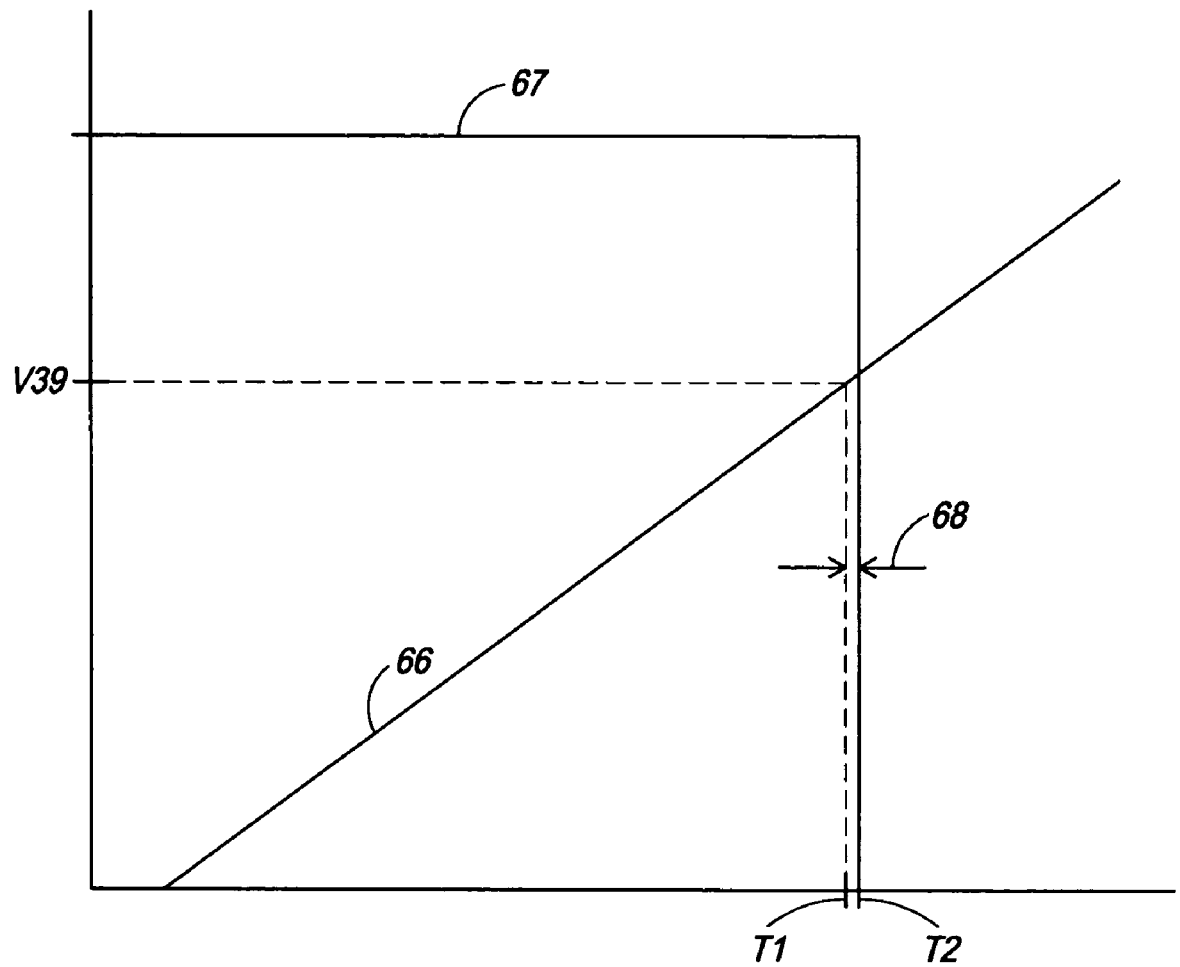
FIG. 4 is a graph having plots that illustrate some of the signals of the timing generator of FIG. 3 in accordance with the present invention.

FIG. 4 is a graph having plots that illustrate some of the signals of generator 35. The abscissa indicates time and the ordinate indicates increasing value of the signal of the illustrated signal. A plot 66 illustrates the voltage at node 52, a plot 67 illustrates the signal formed by transistor 59 on node 61, a time 68 illustrates the delay through transistor 59. This description has references to FIG. 3 and FIG. 4. In addition to removing temperature and semiconductor process variations from the time interval, transistor 59 generally switches much faster than an operational amplifier, thus, the delay through transistor 59 is very small. Consequently, the delay between the voltage across capacitor 55 reaching the reference voltage on node 39 and transistor 59 switching is very small as illustrated by time 68. It is believed that the delay through transistor 59 is about twenty-five percent to eighty percent (25%-80%) of the delay through an operational amplifier that is configured as a comparator. In one particular example embodiment, an operational amplifier type of comparator had a delay of about thirty nano-sec (30 ns) and transistor 59 had a delay of about six nano-sec (6 ns). As a result, the time interval formed by generator 35 at a time T2 is approximately equal to the time interval required to charge capacitor 55 to the reference value at node 39 as illustrated at time T1.

In order to assist in implementing this functionality for generator 35, bias generator 40 is connected between voltage input 22 and return 23. The output of generator 40 is commonly connected to the gate of transistor 41 and the gate of transistor 58. A source of transistor 41 is connected to input 22 and a drain of transistor 41 is commonly connected to a non-inverting input of amplifier 44, and a gate and drain of transistor 42. A source of transistor 42 is connected to return 23. An inverting input of amplifier 44 is commonly connected to input 64, a first terminal of resistor 48, and a source of transistor 45. The output of amplifier 44 is connected to a gate of transistor 45. A drain of transistor 45 is commonly connected to a drain of transistor 49, a gate of transistor 49, and a gate of transistor 50. A source of transistor 49 is commonly connected to a source of transistor 50 and input 22. A drain of transistor 50 is commonly connected to a gate of transistor 59, a drain of transistor 54, and a first terminal of capacitor 55. A second terminal of capacitor 55 is commonly connected to a source of transistor 54 and return 23. A gate of transistor 54 is connected to input 36. A source of transistor 58 is connected to input 22 and a drain is commonly connected to a drain of transistor 59 and an input of buffer 62. A source of transistor 59 is connected to return 23. A second terminal of resistor 48 is connected to return 23.

Figure 5:
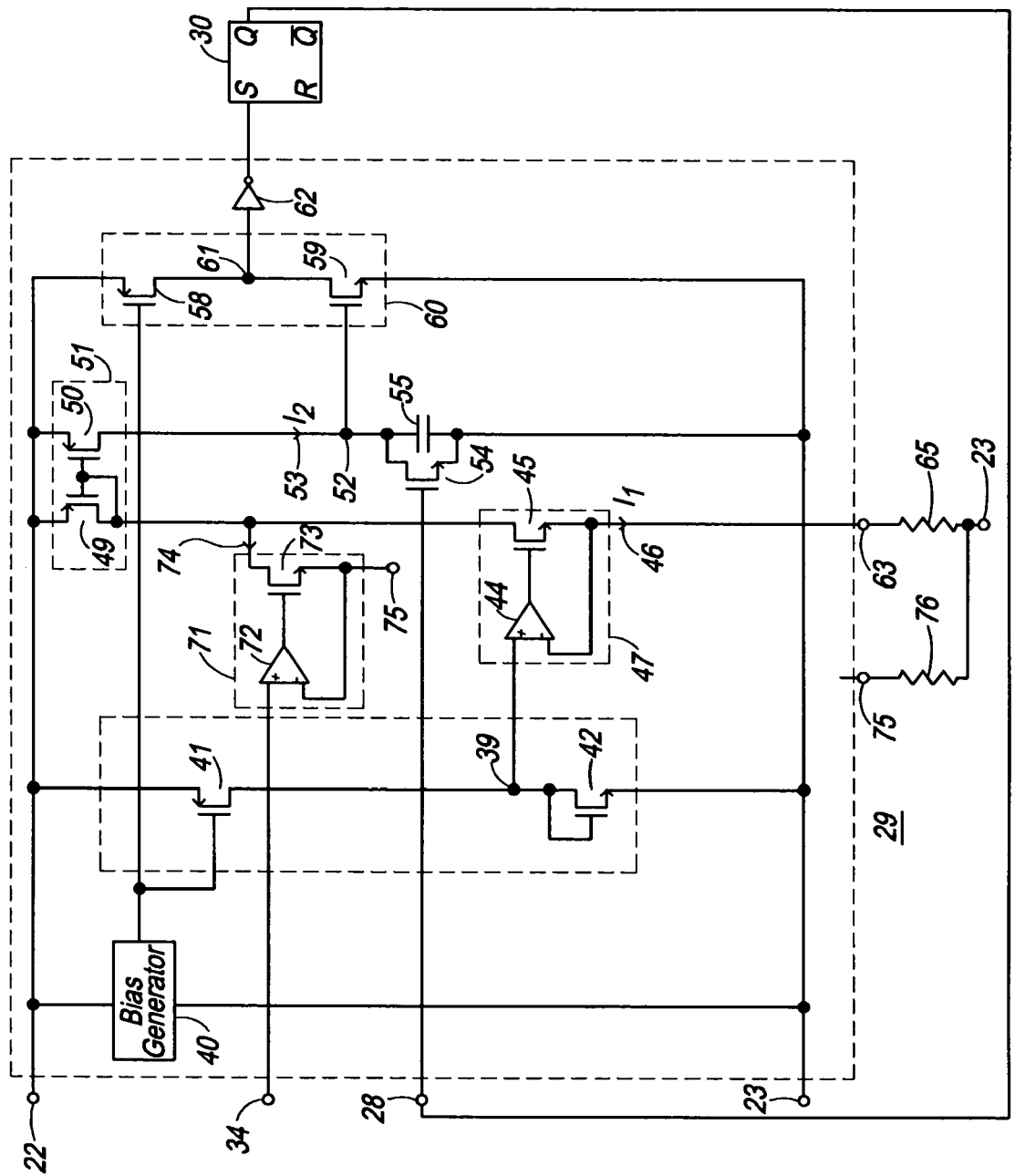
FIG. 5 schematically illustrates an embodiment of a portion of another timing generator that is used in the resonant power supply converter of FIG. 2 in accordance with the present invention.

FIG. 5 schematically illustrates an embodiment of a portion of on-time generator 29. Generator 29 may be similar to generator 35 that was explained in the description of FIG. 2-FIG. 4 except that generator 29 adjusts the time interval as a function of the feedback (FB) signal. Generator 29 includes an input 28 that is similar to input 36 of generator 35, and also includes a FB voltage-to-current converter 71 that receives the feedback voltage and responsively forms a current 74 that is a function of the FB signal. Consequently, the value of the current through transistor 49 is the sum of currents 46 and 74 which is also a function of the value of the FB signal. Converter 71 includes an operational amplifier 72, such as a transconductance amplifier, a transistor 73, and a resistor 76. Resistor 76 generally is external to the semiconductor die on which generator 29 is formed so that the value of resistor 76 may be accurately controlled. Resistor 76 generally connects to converter 71 through an input terminal 75 of generator 29. As the value of the FB signal varies, converter 71 responsively varies or modulates the value of the current through transistor 49, thus current 53, correspondingly to the variation of the FB signal. In the preferred embodiment, the time interval formed by generator 29 is desired to be as accurate as the time interval formed by generator 35 if the FB signal is substantially at the value of return 23. If the FB signal is another value, the time interval formed by generator 29 may not be as precise as the time interval formed by generator 35. Those skilled in the art will appreciate that in other embodiments the time interval formed by generator 29 may not be required to be as precise as generator 35, thus, generator 29 may use a different configuration than the configuration of generator 35.

Although timing generator 35 is illustrated as used within a portion of a resonant power supply controller, those skilled in the art will appreciate that generator 35 may be used with or as a part of any circuit that requires an accurate time interval. Generator 29 also may be used as a part of any circuit that requires a time interval that may be varied by an external signal. Also, on-time generator 29, off-time generator 35, and latch 30 form an oscillator that has a frequency which may be varied by varying the value of the signal on input 34 of generator 29. Such an oscillator is often referred to as a voltage controlled oscillator. The oscillator may be used in various applications that require an oscillator that has an accurate time interval.

Figure 6:
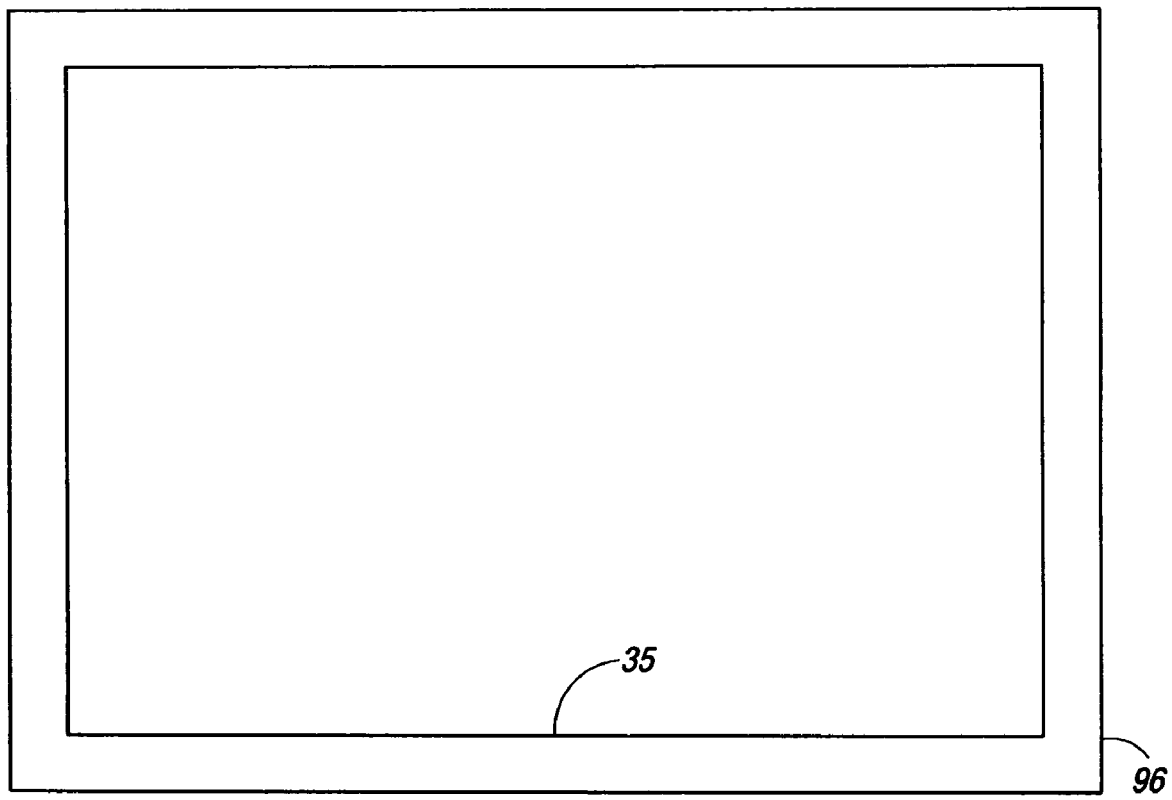
FIG. 6 schematically illustrates an enlarged plan view of a semiconductor device that includes the timing generator of FIG. 3 in accordance with the present invention.

FIG. 6 schematically illustrates an enlarged plan view of a portion of an embodiment of a semiconductor device or integrated circuit 95 that is formed on a semiconductor die 96. Generator 35 is formed on die 96. Die 96 may also include other circuits that are not shown in FIG. 3 for simplicity of the drawing, such as generator 29 or controller 21. Generator 35 and device or integrated circuit 95 are formed on die 96 by semiconductor manufacturing techniques that are well known to those skilled in the art.

In view of all of the above, it is evident that a novel device and method is disclosed. Included, among other features, is using a reference generator and a comparator that have threshold variations that cancel each other. Using a Vgs of an MOS transistor to set the reference and the Vgs of another MOS transistor as a reference to perform the comparison provides a more accurate time interval. Additionally, using bias transistors that have Vgs values that track each other further improves the accuracy of the time interval.

While the subject matter of the invention is described with specific preferred embodiments, it is evident that many alternatives and variations will be apparent to those skilled in the semiconductor arts. More specifically the subject matter of the invention has been described for particular N-channel and P-channel transistor structures, although the method is directly applicable to bipolar transistors, as well as to BiC-MOS, metal semiconductor FETs (MESFETs), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming a timing generator comprising:
coupling a first transistor to form a first reference voltage having a value that is a function of a threshold voltage of the first transistor;
configuring the timing generator to use the first reference voltage to form a charging current that is representative of the first reference voltage;
coupling a capacitor to be charged by the charging current and form a first time varying signal;
configuring a comparator to have a threshold value that tracks the threshold voltage of the first transistor; and
coupling the comparator to compare the first time varying signal to the threshold value of the comparator and responsively form a control signal.

2. The method of claim 1 further including coupling a voltage to current converter to form a first reference current that is representative of the first reference voltage.

3. The method of claim 2 further including coupling a resistor to an output of the voltage to current converter wherein the first reference current flows through the resistor.

4. The method of claim 2 wherein coupling the voltage to current converter includes coupling an operational amplifier to receive the first reference voltage and coupling a second transistor to receive an output of the operational amplifier.

5. The method of claim 2 further including coupling a current mirror to receive the first reference current and form the charging current so that the charging current is ratioed to the first reference current.

6. The method of claim 1 wherein coupling the comparator to compare the first time varying signal includes configuring a second transistor to have a threshold voltage that tracks the threshold voltage of the first transistor.

7. The method of claim 6 further including coupling a control electrode of the second transistor to receive the first time varying signal.

8. A method of forming a timing generator comprising:
coupling a first transistor to form a first reference signal having a value that is a function of a threshold value of the first transistor;
coupling a capacitor to be charged by the first reference signal and form a first time varying signal;
configuring a comparator to have a threshold value that tracks the threshold value of the first transistor including configuring the threshold value of the comparator to substantially cancel an effect of a dependence of the threshold value of the first reference signal so that the asserted time of the control signal is not dependent on the threshold value of the comparator or the threshold value of the first transistor; and
coupling the comparator to compare the first time varying signal to the threshold value of the comparator and responsively form a control signal.

9. A timing generator comprising:
a first transistor having a first threshold voltage, a first current carrying electrode, and having a control electrode coupled to a second current carrying electrode;
a voltage to current converter coupled to the second current carrying electrode of the first transistor, the voltage to current converter configured to form a current that is representative of a voltage received from the first transistor;
a capacitor coupled to receive a charging current that is representative of the current from the voltage to current converter and form a time dependent signal;
a second transistor formed to have a second threshold voltage that tracks the first threshold voltage, a first current carrying electrode, a second current carrying electrode, and a control electrode coupled to receive the time dependent signal; and a third transistor having a third threshold voltage, a control electrode coupled to receive a bias voltage, a first current carrying electrode coupled to the second current carrying electrode of the first transistor, and a second current carrying electrode coupled to receive an input voltage.

10. The timing generator of claim 9 wherein the capacitor includes a first terminal coupled to the control electrode of the second transistor and a second terminal coupled to a voltage return.

11. The timing generator of claim 10 further including a fourth transistor having a first current carrying electrode connected to the first terminal of the capacitor, a second current carrying electrode coupled to a second terminal of the capacitor, and a control electrode coupled to receive a discharge signal from external to the timing generator.

12. The timing generator of claim 9 wherein the voltage to current converter includes a operational amplifier having an inverting input, a non-inverting input coupled to the second current carrying electrode of the first transistor, and an output; and a fourth transistor having a first current carrying electrode, a control electrode coupled to the output of the operational amplifier, and a second current carrying electrode coupled to the inverting input of the operational amplifier.

13. The timing generator of claim 12 further including a resistor having a first terminal coupled to the second current carrying electrode of the fourth transistor, and a second terminal coupled to a voltage return.

14. The timing generator of claim 9 further including a current mirror coupled to receive the current from the voltage to current converter and responsively form the charging current.

15. The timing generator of claim 14 wherein the current mirror includes a fourth transistor having a control electrode and a first current carrying electrode to receive the current from the voltage to current converter, and a second current carrying electrode coupled to receive an input voltage; and a fifth transistor having a first current carrying electrode coupled to supply the charging current to the capacitor, a second current carrying electrode coupled to receive the input voltage, and a control electrode coupled to the control electrode of the fourth transistor.

16. The timing generator of claim 9 further including a fourth transistor having a fourth threshold voltage that tracks the third threshold voltage, a control electrode coupled to receive the bias voltage, a first current carrying electrode coupled to receive the input voltage, and a second current carrying electrode coupled to the second current carrying electrode of the second transistor.

* * * * *

UNITED STATES PATENT AND TRADEMARK OFFICE
CERTIFICATE OF CORRECTION

PATENT NO. : 7,579,892 B2
APPLICATION NO. : 11/441328
DATED : August 25, 2009
INVENTOR(S) : Petr Kadanka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 329 days.

Signed and Sealed this

Fourteenth Day of September, 2010

David J. Kappos
*Director of the United States Patent and Trademark Office*